(12) United States Patent
Xu et al.

(10) Patent No.: US 8,873,278 B1
(45) Date of Patent: Oct. 28, 2014

(54) VOLATILE MEMORY ELEMENTS WITH SOFT ERROR UPSET IMMUNITY

(71) Applicant: Altera Corporation, San Jose, CA (US)

(72) Inventors: Yanzhong Xu, Santa Clara, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 43 days.

(21) Appl. No.: 13/732,737

(22) Filed: Jan. 2, 2013

Related U.S. Application Data

(62) Division of application No. 12/571,143, filed on Sep. 30, 2009, now Pat. No. 8,355,292.

(60) Provisional application No. 61/101,998, filed on Oct. 1, 2008.

(51) Int. Cl.
*G11C 11/00* (2006.01)

(52) U.S. Cl.
USPC .............. 365/154; 365/49.1; 365/49.11

(58) Field of Classification Search
CPC ..... G11C 11/41; G11C 11/412; G11C 11/413
USPC ....................... 365/154, 49.1, 49.11
See application file for complete search history.

(56) References Cited

U.S. PATENT DOCUMENTS

| | | | |
|---|---|---|---|
| 4,380,055 A | 4/1983 | Larson | |
| 6,172,900 B1 | 1/2001 | Mejia | |
| 6,175,533 B1 | 1/2001 | Lee et al. | |
| 6,275,080 B1 | 8/2001 | Phan et al. | |
| 6,549,453 B2 * | 4/2003 | Wong | 365/156 |
| 6,756,692 B2 | 6/2004 | Hirano et al. | |
| 6,876,572 B2 | 4/2005 | Turner | |
| 6,972,987 B1 | 12/2005 | Wong et al. | |
| 6,975,041 B2 | 12/2005 | Hirano et al. | |
| 7,023,235 B2 * | 4/2006 | Hoff | 326/10 |
| 7,277,351 B2 | 10/2007 | Liu et al. | |
| 7,339,816 B1 | 3/2008 | Dastidar | |
| 7,352,610 B1 | 4/2008 | Pedersen et al. | |
| 7,359,272 B2 * | 4/2008 | Wang et al. | 365/226 |
| 7,388,772 B1 | 6/2008 | Xu et al. | |
| 7,411,853 B2 | 8/2008 | Liu et al. | |
| 7,430,148 B2 | 9/2008 | Liu et al. | |
| 7,570,537 B2 | 8/2009 | Bhatia | |
| 7,596,013 B2 | 9/2009 | Yamaoka et al. | |
| 7,768,818 B1 | 8/2010 | Chan et al. | |

(Continued)

OTHER PUBLICATIONS

Perisetty, Srinivas. U.S. Appl. 12/134,138, filed Jun. 5, 2008.

*Primary Examiner* — Han Yang
(74) *Attorney, Agent, or Firm* — Treyz Law Group; Jason Tsai

(57) ABSTRACT

Memory elements are provided that exhibit immunity to soft error upset events when subjected to high-energy atomic particle strikes. The memory elements may each have ten transistors. To overcome difficulties in writing data into the memory elements, signal strengths for one or more of the signals provided to the array may be adjusted. There may be two positive power supply voltages that are used in powering each memory element. One of the power supply voltages may be temporarily lowered relative to the other power supply voltage to enhance write margin during data loading operations. Other signal strengths that may be adjusted in this way include other power supply signals, data signal levels, address and clear signal magnitudes, and ground signal strengths. Adjustable power supply circuitry and data read-write control circuitry may be used in making these signal strength adjustments.

20 Claims, 12 Drawing Sheets

(56) References Cited

U.S. PATENT DOCUMENTS

| | | |
|---|---|---|
| 7,791,941 B2 | 9/2010 | Hanafi |
| 7,821,050 B1 | 10/2010 | Liu et al. |
| 8,081,010 B1 * | 12/2011 | Whitaker et al. ............... 326/12 |
| 8,107,279 B2 | 1/2012 | Yamaoka et al. |
| 2002/0130348 A1 | 9/2002 | Tran |
| 2004/0027902 A1 | 2/2004 | Ooishi et al. |
| 2006/0023535 A1 | 2/2006 | Chun et al. |
| 2006/0092745 A1 | 5/2006 | Do |
| 2006/0109706 A1 | 5/2006 | Joshi |
| 2006/0262612 A1 | 11/2006 | Lovett |
| 2007/0041242 A1 | 2/2007 | Okazaki et al. |
| 2007/0121370 A1 * | 5/2007 | Ellis et al. ..................... 365/154 |
| 2008/0087927 A1 | 4/2008 | Shin et al. |
| 2008/0094878 A1 | 4/2008 | Joshi et al. |
| 2009/0161410 A1 * | 6/2009 | Houston ..................... 365/154 |
| 2010/0110773 A1 * | 5/2010 | Sachdev et al. ............... 365/154 |
| 2010/0172195 A1 * | 7/2010 | Moore et al. ............ 365/189.16 |

* cited by examiner

VOLATILE MEMORY ELEMENTS WITH SOFT ERROR UPSET IMMUNITY

This application is a continuation of patent application Ser. No. 12/571,143, filed Sep. 30, 2009, which claims the benefit of provisional patent application No. 61/101,998, filed Oct. 1, 2008, and both of which are hereby incorporated by reference herein in their entireties.

BACKGROUND

This invention relates to volatile memory elements, and more particularly, to volatile memory elements that demonstrate soft error upset immunity for integrated circuits such as programmable logic devices.

Integrated circuits often contain volatile memory elements. Typical volatile memory elements are based on cross-coupled inverters (latches). A volatile memory element retains data only so long as the integrated circuit is powered. In the event of power loss, the data in the volatile memory element is lost. Although nonvolatile memory elements such as memory elements based on electrically-erasable programmable read-only memory technology are not subject to data loss in this way, it is often not desirable or possible to fabricate nonvolatile memory elements as part of a given integrated circuit.

As a result, volatile memory elements are often used. For example, static random-access memory (SRAM) chips contain SRAM cells, which are a type of volatile memory element. Volatile memory elements are also used in programmable logic device integrated circuits.

Volatile memory elements are subject to a phenomenon known as soft error upset. Soft error upset events are caused by cosmic rays and radioactive impurities embedded in integrated circuits and their packages. Cosmic rays and radioactive impurities generate high-energy atomic particles such as neutrons and alpha particles. The memory elements contain transistors and other components that are formed from a patterned silicon substrate. When an atomic particle strikes the silicon in the memory element, electron-hole pairs are generated. The electron-hole pairs create a conduction path that can cause a charged node in the memory element to discharge and the state of the memory element to flip. If, for example, a "1" was stored in the memory element, a soft error upset event could cause the "1" to change to a "0."

Upset events in an integrated circuit corrupt the date stored in the memory elements and can have serious repercussions for system performance. In certain system applications such as remote installations of telecommunications equipment, it is extremely burdensome to repair faulty equipment. Unless programmable logic devices and other integrated circuits demonstrate good immunity to soft error upset events, they will be unsuitable for these types of applications.

It would therefore be desirable to be able to improve the soft error upset performance of volatile memory elements in integrated circuits such as programmable logic device integrated circuits.

SUMMARY

Integrated circuits with static random-access memory cells are provided. The integrated circuits may be programmable integrated circuits, memory chips, or any other suitable integrated circuits. The memory cells may be used as static random-access memory (SRAM) or, in programmable integrated circuits, the memory cells may be used as configuration random-access memory (CRAM).

Each cell may have a robust circuit formed from ten transistors (as an example). The cells may exhibit good immunity to soft error upset events. To provide sufficient margin when accessing data, voltages to the cell may be varied in real time. For example, the cell may be powered using two positive power supply voltages. Some of the circuitry in the cell may be weakened relative to other circuitry in the cell during write operations by lowering one of the positive power supply voltages. This helps to ensure that the write operation will be successful. This type of scheme may also be implemented using elevated address signals, elevated clear signals, lowered ground voltages, lowered or elevated data signals and complementary data signals, etc.

Further features of the invention, its nature and various advantages will be more apparent from the accompanying drawings and the following detailed description of the preferred embodiments.

DETAILED DESCRIPTION

The present invention relates to integrated circuit memory elements that are resistant to soft error upset events and to methods for using such memory elements. The memory elements, which are sometimes referred to as cells, may contain any suitable number of transistors. With one suitable arrangement, each cell contains ten transistors. If desired, more than ten transistors may be used in each cell. For example, each cell may contain eleven transistors, twelve transistors, or more than twelve transistors. Cells with fewer than ten transistors may also be used. Each cell may have five, six, seven, eight, or nine transistors, if desired. If desired, the voltage levels that are associated with power supply signals, control signals, transistor body biasing signals, and/or data signals for the cells can be adjusted in real time to enhance performance.

The memory elements can be used in any suitable integrated circuits that use memory. These integrated circuits may be memory chips, digital signal processing circuits with memory arrays, microprocessors, application specific integrated circuits with memory arrays, programmable integrated circuits such as programmable logic device integrated circuits in which memory elements are used for configuration memory, or any other suitable integrated circuit. For clarity, the present invention will sometimes be described in the context of programmable logic device integrated circuits. This is, however, merely illustrative. Memory cells in accordance with embodiments of the present invention may be used in any suitable circuits. On integrated circuits such as memory chips or other circuits in which memory is needed to store processing data, memory elements 20 perform the functions of static random-access memory (RAM) cells and are sometimes referred to as SRAM cells. In the context of programmable logic device integrated circuits, the memory elements can be used to store configuration data and are therefore sometimes referred to in this context as configuration random-access memory (CRAM) cells.

Figure 1:
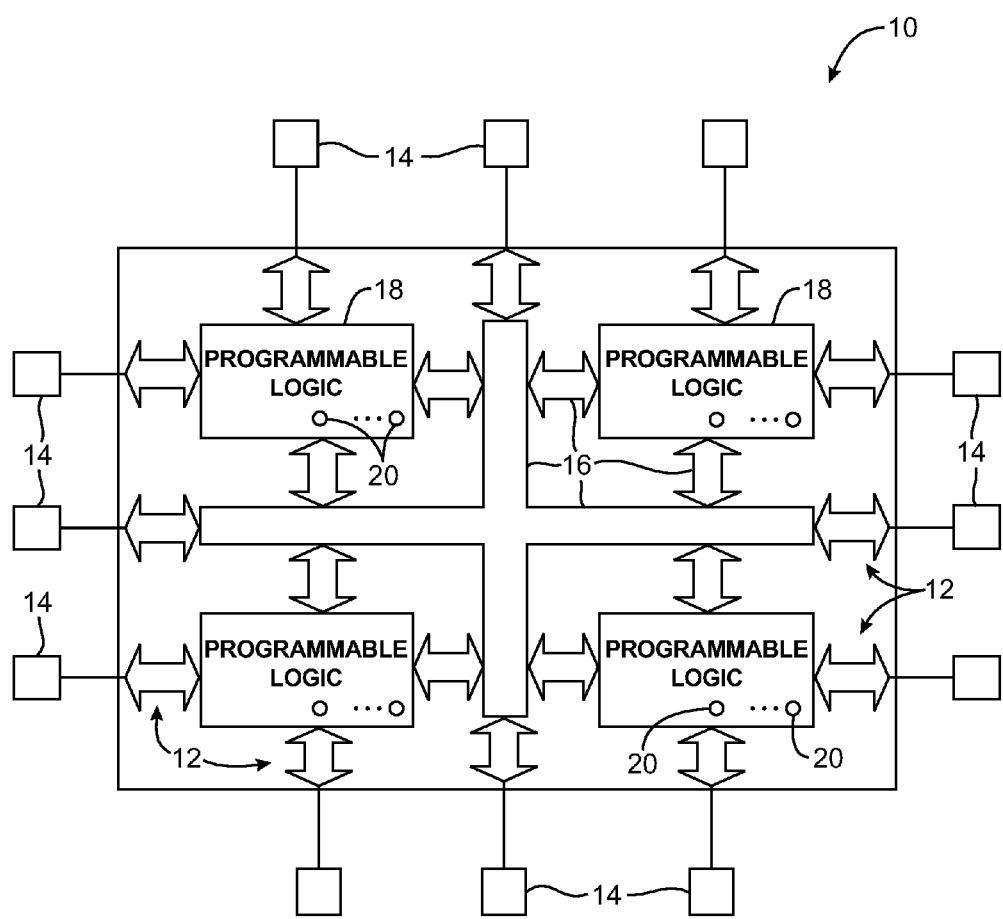
FIG. 1 is a diagram of an illustrative integrated circuit that may contain random-access memory cells in accordance with an embodiment of the present invention.

An illustrative integrated circuit such as a programmable logic device 10 in accordance with an embodiment of the present invention is shown in FIG. 1.

Device 10 may have input/output circuitry 12 for driving signals off of device 10 and for receiving signals from other devices via input/output pins 14.

Interconnection resources 16 such as global and local vertical and horizontal conductive lines and busses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains volatile memory elements 20 that can be loaded with configuration data (also called programming data) using pins 14 and input/output circuitry 12. Once loaded, the memory elements each provide a corresponding static control output signal that controls the state of an associated logic component in programmable logic 18. If desired, memory elements 20 may be used in SRAM-type memory arrays (e.g., to store data for processing circuitry during operation of device 10).

Each memory element 20 may be formed from a number of transistors configured to form a bistable circuit. With one suitable approach, complementary metal-oxide-semiconductor (CMOS) integrated circuit technology is used to form the memory elements 20, so CMOS-based memory element implementations are described herein as an example. If desired, other integrated circuit technologies may be used to form the memory elements and the integrated circuit in which the memory elements are used to form memory arrays.

The memory elements may be loaded from an external erasable-programmable read-only memory and control chip or other suitable data source via pins 14 and input/output circuitry 12. Loaded CRAM memory elements 20 may provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors, parts of multiplexers, look-up tables, logic arrays, AND, OR, NAND, and NOR logic gates, etc.

The memory elements 20 may be arranged in an array pattern. In a typical modern programmable logic device, there may be millions of memory elements 20 on each chip. During programming operations, the array of memory elements is provided with configuration data by a user (e.g., a logic designer). Once loaded with configuration data, the memory elements 20 selectively control portions of the circuitry in the programmable logic 18 and thereby customize its functions so that it will operate as desired.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
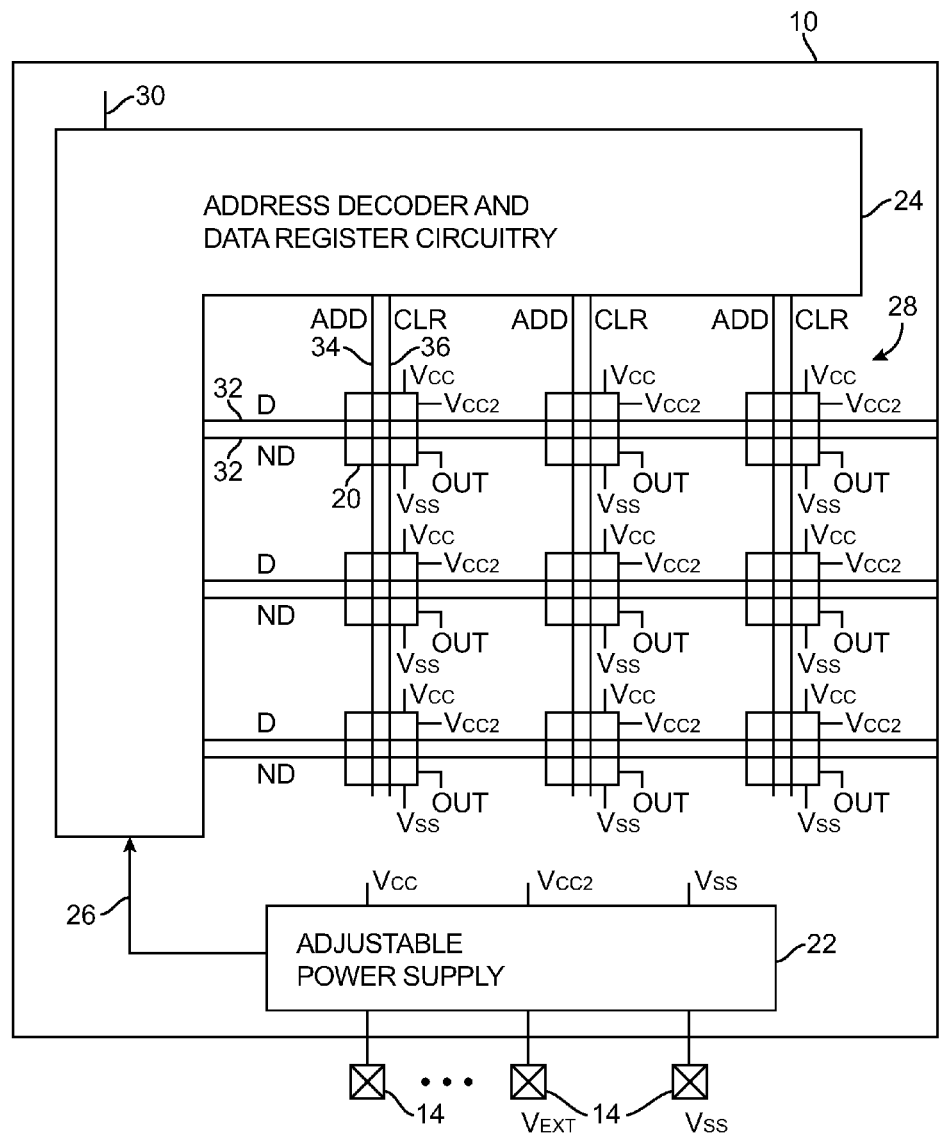
FIG. 2 is a diagram of an illustrative array of memory cells in accordance with an embodiment of the present invention.

When memory elements 20 are arranged in an array, horizontal and vertical conductors and associated loading circuitry may be used to load the memory elements with configuration data. Any suitable memory array architecture may be used for memory elements 20. One suitable arrangement is shown in FIG. 2. As shown in FIG. 2, integrated circuit 10 may have power regulator circuitry 22. Power regulator circuitry 22 may receive external voltages via pins 14. For example, power regulator circuitry may receive one or more positive power supply voltages such as Vext and a ground voltage Vss (e.g., 0 volts). Examples of positive power supply voltages that may be received include a 0.9 volt positive power supply voltage, a 2.5 volt positive power supply voltage, etc.

Adjustable power supply circuit 22 may produce internal power supply voltages on its outputs. These power supply voltages may include positive power supply voltages Vcc and Vcc2, ground power supply voltage Vss (e.g., 0 volts), and other suitable voltages. One or more of these voltages may be provided to address decoder and data register circuitry 24 via paths such as path 26.

Circuitry 24 may be used to read and write data from memory cell array 28. When array 28 is being used as regular SRAM, data write operations may be performed when it is desired to store processing results and data read operations may be performed when it is desired to retrieve stored data.

When array 28 is being used as CRAM, data write operations may be performed to load configuration data and data read operations may be performed to confirm that configuration data loading operations have been performed successfully.

Array 28 may include rows and columns of memory cells 20. In the example of FIG. 2, there are three rows and three columns of memory elements 20 in array 28. This is merely illustrative. Integrated circuits such as integrated circuit 10 may have any suitable number of memory elements 20. A typical memory array might, as an example, have thousands or millions of memory elements 20 arranged in hundreds or thousands or rows and columns.

Power regulator circuitry 22 may generate the time-varying power supply signals. For example, the magnitude of signals Vcc2 and Vcc may, if desired, be varied as a function of time. It may, as an example, be desirable to lower Vcc2 relative to Vcc during data writing operations to help those data writing operations succeed. Similarly, address decoder and data register circuitry 24 may use the power supply signals on path 26 to generate signals with time-varying magnitudes. For example, the magnitude of a "logic high" address signal ADD may be varied as a function of time (e.g., from a lower value of 0.9 volts to a higher value of 1.2 volts). The magnitudes of data signals D, ND, clear signal CLR, and Vss, can likewise be changed as a function of time in addition to the normal time variations that these signals experience when transitioning from their logic high to logic low values. Signal magnitude variations can be imposed on both logic high signals (e.g., by temporarily reducing a logic high value from 0.9 volts to 0.7 volts) and logic low signals (e.g., by temporarily reducing a logic low value from 0 volts to −0.2 volts). Combinations of positive voltage variations and ground voltage variations may also be made if desired.

Circuitry 24 may control clearing and data loading operations for array 28. Circuitry 24 may receive data such as configuration data from external sources via input path 30. In a typical programmable logic device system, configuration data is loaded into a programmable logic device from a memory and data loading circuit. This type of circuit, which is sometimes referred to as a configuration device, loads configuration data into registers within circuitry 24. Address decoder circuits in circuitry 24 may receive external control signals or addressing control signals can be generated internally in circuitry 24. Address signals are labeled ADD in FIG. 2, but are typically controlled independently in each column.

Circuitry 24 may produce clear signals such as signal CLR on clear lines 36. When clearing a CRAM array, it is generally desirable to tie all clear lines 36 to a common control node, so that CLR is asserted simultaneously for all cells in the array. In SRAM arrays, CLR signals can be used in cell addressing and can be asserted independently for different groups of cells).

The signal CLR is asserted with circuitry 24 when it is desired to clear the contents of the memory array 28. Clearing operations for CRAM arrays are typically performed upon system power-up or during reconfiguration. After the array has been cleared, the CLR signal can be deasserted and the configuration data can be loaded.

Configuration data may be loaded into registers in circuitry 24 in series. These registers may then apply the configuration data in parallel to array 28 via true and complementary data lines D and ND (lines 32). Address decoder circuitry in circuitry 24 may receive addressing information via input 30. The address decoder circuitry can then systematically assert desired address lines 34. As the address line in each column is asserted (i.e., as the signal ADD in a given column is taken high), the data on the data lines 32 is loaded into the memory elements 20 in that column. By addressing each column in this way, the entire array 28 may be loaded with configuration data. After the array has been loaded, the output 38 of each memory element 20 produces a corresponding static control signal for controlling the gate of a pass transistor or other logic component in the programmable logic 18 of the programmable logic device 10 (FIG. 1). Data reading operations may be performed by systematically asserting desired address lines and monitoring the resulting data on data lines 32 (e.g., using sense amplifier circuitry in circuitry 24).

To ensure that memory elements 20 are resistant to soft error upset events, memory elements 20 may be implemented using an interconnected set of inverter-type circuits. The interconnected set of inverter-type circuits may form a storage portion of a memory element (i.e., a bistable cell). There may be, for example, a ring of four inverter-type circuits with redundantly interconnected inputs and outputs. Each inverter-type circuit may be implemented using a pair of transistors. In particular, each inverter-type circuit may have a p-channel metal-oxide-semiconductor (PMOS) transistor and an n-channel metal-oxide-semiconductor (NMOS) transistor.

If desired, a ring of two inverters may be used to form the storage portion. The two inverters may be cross-coupled (e.g., the output of an inverter is connected to the input of another inverter, and the output of the other inverter is connected to the input of the inverter). The two inverters may each be coupled to a different power supply. For example, one inverter may be powered at Vcc1 and Vss, and the other inverter may be powered at Vcc2 and Vss, where Vcc1 and Vcc2 may be independently controlled. If desired, any number of inverter-type circuits may be used to form the storage portion of a memory cell.

Each transistor may have a drain, source, body, and gate terminal. The drains and sources of metal-oxide-semiconductor transistors are sometimes collectively referred to as "source-drain" terminals. In each inverter-type circuit, the PMOS transistor and NMOS transistor are connected in series between a positive power supply terminal and a ground power supply terminal. In this configuration, the PMOS transistor and the NMOS transistor may each have a first source-drain terminal that is connected at a common node. The PMOS transistor has a second source-drain terminal coupled to a positive power supply terminal. The NMOS transistor has a second source-drain terminal coupled to a ground terminal.

Address transistors (sometimes referred to as clear transistors, access transistors, read-write transistors, etc.) may be used to access the memory elements. In particular, the address transistors may be used to load data into the memory elements and may be used to read loaded data from the memory elements. In a typical configuration, there are two address transistors associated with each memory element. These address transistors may be controlled using a common control signal or may be controlled with independent control signals. With one suitable arrangement, a first address transistor is coupled to a first internal storage node in the memory element and a second address transistor is coupled to a second internal storage node in the memory element. The first address transistor may be controlled by a first control signal (e.g., a signal ADD). The second address transistor may be controlled by a second control signal (e.g., a signal CLR). Additional address transistors or other memory element access circuitry may be used. These address transistors (access transistors) may be controlled by one or more access control signals (e.g., ADD, CLR, etc.). The use of access transistor arrangements with two address transistors and two address (access) control signals are sometimes described herein as an example. This is, however, merely illustrative. In general, any suitable number of access transistors may be used in reading and writing data into each memory element and any suitable number of access control signals may be used in controlling the access transistors. Moreover, the data that is read into and out of each memory cell may be provided in true form (data D), complementary form (complementary data ND), or combinations of true and complementary form. Data signals may be set to logic zero values during clear operations or a dedicated ground signal may be used during clearing (as examples).

Figure 3:
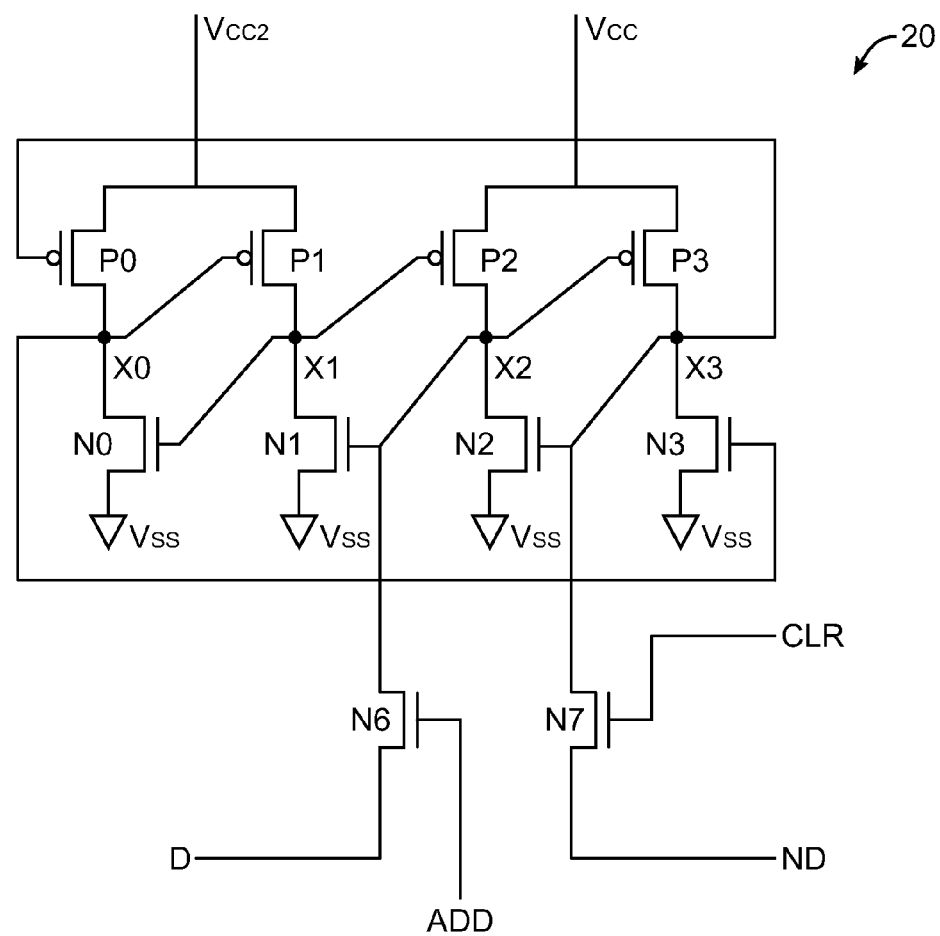
FIG. 3 is a diagram of an illustrative memory cell in accordance with an embodiment of the present invention.

A memory element 20 of the type that may be used in array 28 of FIG. 2 is shown in FIG. 3. As shown in FIG. 3, memory element 20 may have p-channel metal-oxide-semiconductor (PMOS) transistors P0, P1, P2, and P3 and re-channel metal-oxide-semiconductor (NMOS) transistors N0, N1, N2, N3, N6, and N7. Memory element 20 contains four inverter-type circuits. A first inverter-type circuit is formed by the series-connected transistor pair of P0 and N0. A second inverter-type circuit is formed by series-connected transistors P1 and N1. Third and fourth inverter-type circuits are formed by series-connected transistors P2 and N2 and series-connected transistors P3 and P4, respectively. The inputs of each inverter-type circuit are received from the outputs of two other inverter-type circuits. For example, the gate control signal for transistor P0 is provided by the output of the fourth inverter-type circuit (P3/N3), whereas the gate control signal for the transistor N0 is received from the output of the second inverter-type circuit (P1/N1). Interconnecting the inverter-type circuits with this type of redundant interconnect pattern makes cell 20 resistant to soft error upset events.

Data can be conveyed over true and complement data lines D and ND. Address signal ADD may be used to control address transistor N6 (e.g., by modulating access control signal ADD on the gate of transistor N6). Clear signal CLR may be used to control clear transistor N7 (e.g., by adjusting access control signal CLR on the gate of transistor N7). Ground terminals Vss may be powered using a ground voltage of 0 volts or other suitable ground voltage.

Adjustable power supply circuitry 22 of FIG. 2 may power memory element 20 with positive power supply voltage Vcc and positive power supply voltage Vcc2. Any suitable voltage levels may be used for Vcc and Vcc2. For example, Vcc and Vcc2 may be maintained at the same voltage (e.g., by shorting the Vcc and Vcc2 terminals together). With one suitable arrangement, Vcc may be fixed at 0.9 volts and Vcc2 may be a time varying signal. For example, Vcc2 may be held at 0.9 volts during normal operation and may be temporarily reduced to a value of less than 0.9 volts during data writing operations. With other suitable arrangements, Vcc and Vcc2 may have different values, may both be time-varying, may both be fixed, etc.

There are four labeled nodes in memory element 20 of FIG. 3: X0, X1, X2, and X3. Nodes X0, X1, X2, and X3 form internal storage nodes in memory element 20. Any of these nodes may be used as output 38 of FIG. 2. For example, node X2 may be connected to output 38 of FIG. 2.

Memory element 20 exhibits bistable operation. When memory element has been loaded with a "1," the values of X0, X1, X2, and X3 will be "1," "0,", "1," and "0," respectively. When memory element has been loaded with a "0," the values of X0, X1, X2, and X3 will be "0," "1,", "0," and "1," respectively.

In configurations in which there are different numbers of inverter-type circuits (i.e., different numbers of series-connected p-channel and n-channel transistor pairs), there may be different numbers of internal storage nodes. The arrangement of FIG. 3 in which there are four internal storage nodes is merely illustrative.

During normal operation, each memory element 20 stores its loaded data while supplying an output from one of its internal storage nodes (e.g., node X2) to the gate of an associated programmable pass transistor. This configures the programmable transistor by turning the programmable transistor on or off depending on the state of node X2 (e.g., to implement part of a custom logic design).

During this type of normal operation, signals ADD and CLR in each cell 20 are deasserted (e.g., ADD and CLR are low), so that address transistors N6 and N7 in each cell 20 are off. With address transistors N6 and N7 off, data signal line 32 will be isolated from the latch transistors in cell 20 (i.e., transistors P0, N0, P1, N1, P2, N2, P3, and N3).

With transistors N6 and N7 off, cell 20 holds its loaded data value and exhibits good immunity to radiation-induced upset events.

Consider, as an example, the situation in which node X0 and node X2 are low ("0") and node X1 and node X3 are high ("1"). If radiation strikes node X0, radiation-induced charge on node X0 may cause the voltage on node X0 to go high (e.g., to positive power supply voltage Vcc or even higher). When the voltage on node X0 goes high, transistor N3 in transistor pair P3/N3 turns on. The voltage on node X2 is low, so transistor P3 is already on. With both transistor N3 and P3 on, the voltage on node X3 falls to a voltage between Vcc and Vss (e.g., to about Vcc/2 or even lower, which is roughly midway between the positive power supply voltage of Vcc applied to terminal 40 and the ground voltage Vss of 0 volts on ground terminal 44).

The high X0 voltage that was produced by the radiation strike is routed to the gate of p-channel metal-oxide-semiconductor transistor P1. This turns off transistor P1. N-channel metal-oxide-semiconductor transistor N1 has a gate controlled by the signal on node X2. Because node X2 is low, transistor N1 is off. When transistor P1 is turned off while transistor N1 is off, node X1 is no longer directly connected to either positive power supply voltage Vcc on positive power supply line 42 or ground voltage Vss on ground power supply line 44. Node X1 therefore floats, retaining its original high state, despite the radiation strike.

The unperturbed signal on node X1 serves as a control signal that is applied to the gate of transistor P2. Before the radiation strike, node X1 was high and transistor P2 was off. After the radiation strike, node X1 retains its original high state, so the state of transistor P2 is unchanged. Transistor N2 is controlled by a reduced high voltage (Vcc/2), but is able to hold node X2 low, because transistor P2 remains off. As with the unperturbed signal on node X1, the voltage on node X2 is therefore unperturbed by the radiation strike.

Because the voltage on node X2 remains low, transistor P3 remains on and pulls node X3 high. Even though node X3 is momentarily reduced in voltage from Vcc to Vcc/2, the node X3 signal is still able to hold transistor P0 at least partially off, so that transistor N0, which is held on by unperturbed high signal on node X1, is able to pull node X0 low. Eventually, the radiation-induced charge on node X0 that momentarily elevated the voltage on node X0 will dissipate and node X0 will return to its normal (pre-strike) state of 0 volts. Once X0 reaches 0 volts, transistor N3 turns off and node X3 regains its pre-strike voltage of Vcc.

As this example demonstrates, the architecture of cell 20 allows the cell to retain its stored data value (a stored "1" in this example), even when a node in the cell is struck by radiation. Cell 20 configured in this way may exhibit a substantial hold margin.

During other cell operations (e.g., a write operation), data may be loaded into memory element 20 by asserting address signal ADD (and, if desired, signal CLR—e.g., in SRAM arrays).

Consider, as an example, the situation in which it is desired to load a 1 onto node X2. If node X2 is already high, no transitions will take place during data loading operations. If, however, the current state of node X2 is low, transitions will occur.

When loading a 1 onto a low node X2, data signal D will be 1 (high) and its complement ND will be 0 (low). While D is high, address line ADD is taken high to turn on transistor N6. Clear signal CLR can optionally also be taken high at the same time (to drive a low ND signal onto X3), such as in situations in which array 28 is being used as a regular SRAM array and not a CRAM array.

When transistor N6 is turned on by the high ADD signal, N6 attempts to drive a 1 onto node X2, thereby overcoming the original low value of X2. When this operation succeeds and the states of all of nodes X0, X1, X2, and X3 have been flipped, the writing operation will be complete. Note, however, that while node X2 is directly accessible through transistor N6 (and node X3 is optionally directly accessible through transistor N7), nodes X0 and X1 can only be accessed indirectly. This is because there are no drive transistors directly associated with nodes X0 and X1. Instead, the values of X0 and X1 must be flipped indirectly, by virtue of flipping the values of the other nodes in memory element 20.

In the present example, driving the logic high signal onto node X2 turns on transistor N1 and pulls node X1 low. Note, however, that transistor P1 is on, and is attempting to hold node X1 high. As a result, transistor N1 must compete with transistor P1. Similarly, the low signal that may optionally be driven though N7 onto node X2 would be turning on P0 to pull X0 high (indirectly), while transistor N0 is on and attempting to hold X0 low. Transistor P0 (if used in this way) must therefore compete with transistor N0.

As discussed above, cell 20 may exhibit substantial hold margin. Memory cells having large hold margins often suffer from degraded write margins. To ensure sufficient write margin during data loading operations such as these, power supply 22 (FIG. 2) can selectively lower the power supply voltage Vcc2 to memory element 20 during data writing operations. This helps to ensure that transistor N1 will succeed in overpowering transistor P1 (and that transistor P0 will overpower transistor N0). By selectively weakening transistor P1 relative to transistor N1 and by ensuring that transistor P0 is stronger than transistor N0, the loading operation is made easier, thereby increasing the likelihood that the operation will succeed (i.e., improving write margin). The lowering of voltage Vcc2 relative to voltage Vcc also helps ensure satisfactory loading of a logic "0" into memory element 20 when memory element 20 is storing a logic "1."

Figure 4:
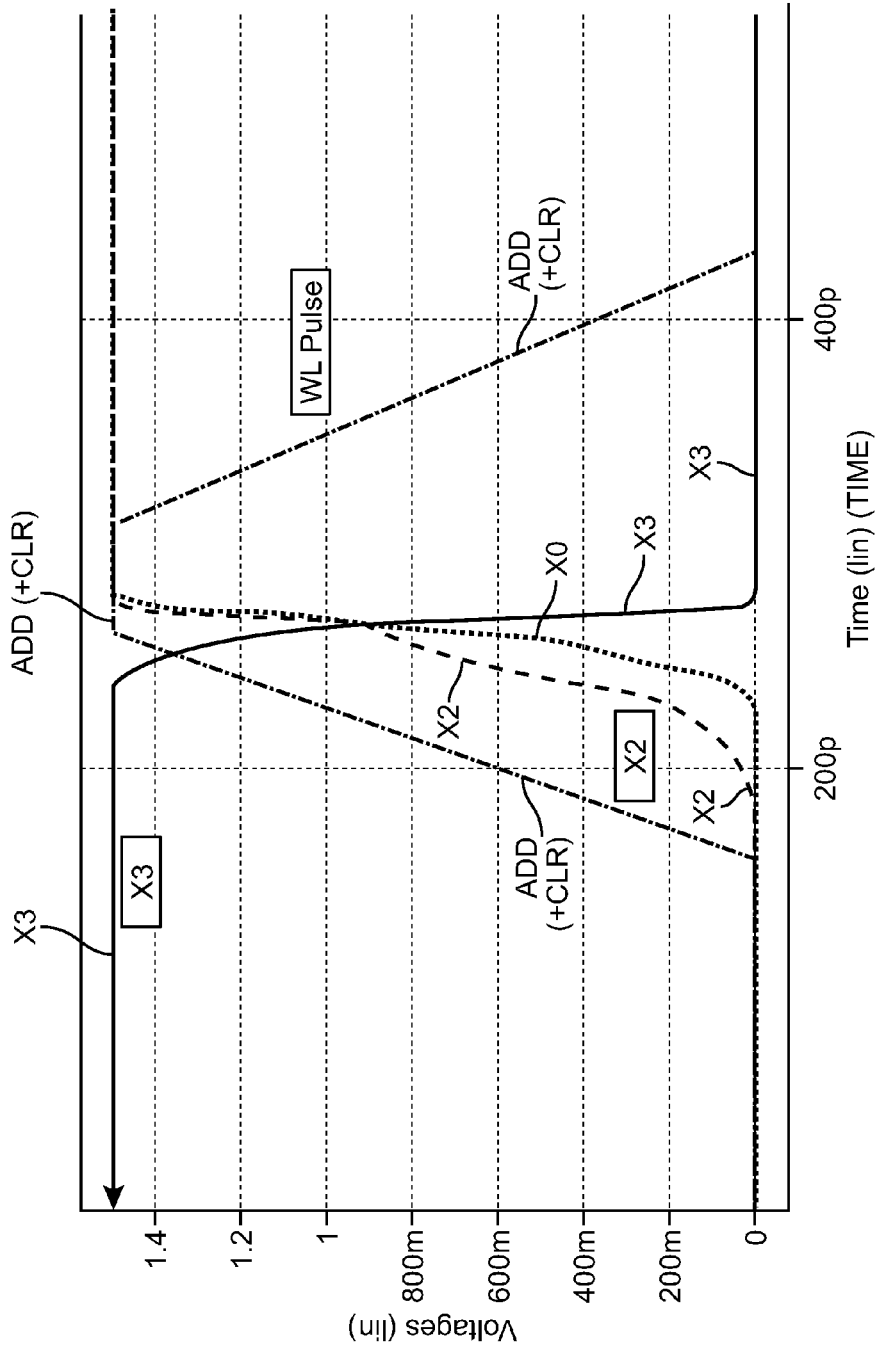
FIG. 4 is a graph of simulation results showing how the state of the illustrative memory cell of FIG. 3 may be flipped even when no changes are made to the power supply voltages to the cell during write operations in accordance with an embodiment of the present invention.

FIG. 4 shows simulation results in a scenario in which the address (and clear) line has been asserted while D is high to write a "1" onto node X2 without lowering Vcc2 (i.e., with Vcc=Vcc2). As shown in FIG. 4, the write operation is successful, even without adjusting Vcc2 to improve write margin. However, there may not always be sufficient write margin using this type of scheme (e.g., when CLR is not asserted simultaneously with ADD or when manufacturing variations cause the strengths of the transistors in the memory element to vary in a particular way). For example, in a worst case scenario, the presence of random variation may result in fabricating a weaker transistor N1 (relative to transistor P1) and in forming a weaker P0 (relative to transistor N0). In the worst case scenario, data may not be successfully written (e.g., loaded) if Vcc2 is equal to Vcc.

Figure 5:
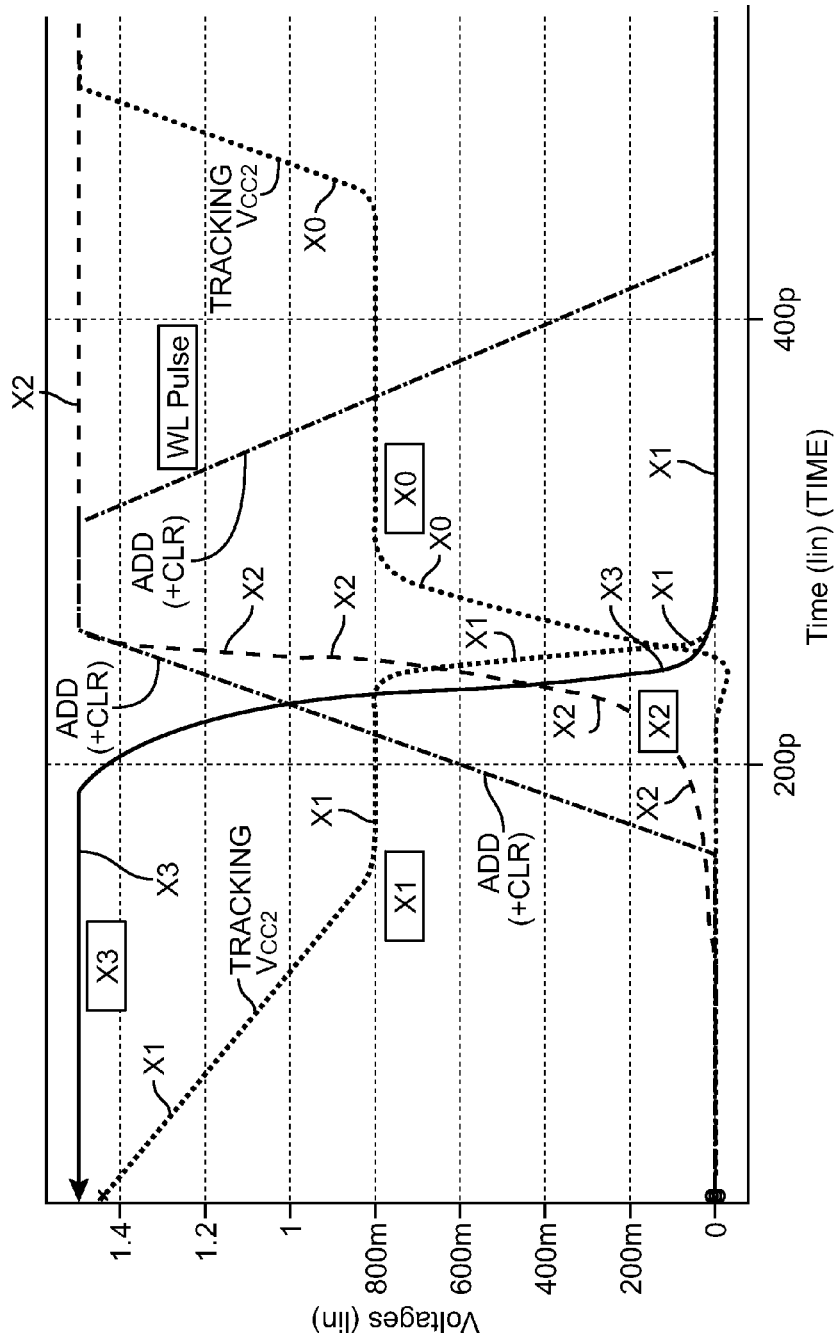
FIG. 5 is a graph of simulation results showing how the state of the illustrative memory cell of FIG. 3 may be changed while lowering at least one power supply voltage during write operations in accordance with an embodiment of the present invention.

Accordingly, as shown in FIG. 5, write results have been simulated in which Vcc2 is lowered temporarily by power supply 22 during write operations. In the diagram of FIG. 5, the voltages on nodes X1 and X0 can be seen to track the fall and rise of Vcc2. Voltages on nodes X1 and X0 may track the fall and rise of Vcc2 because nodes X1 and X0 are statically driven by Vcc2 through P1 and P0 respectively. After the address signal is asserted, the voltages on nodes X2 and X3 may flip, indicating that the state of memory element 20 has been successfully flipped. As discussed previously, a write operation performed in this way may improve write margin. A successful write may still be possible in the worst case scenario, provided that Vcc2 is lowered.

Figure 6:
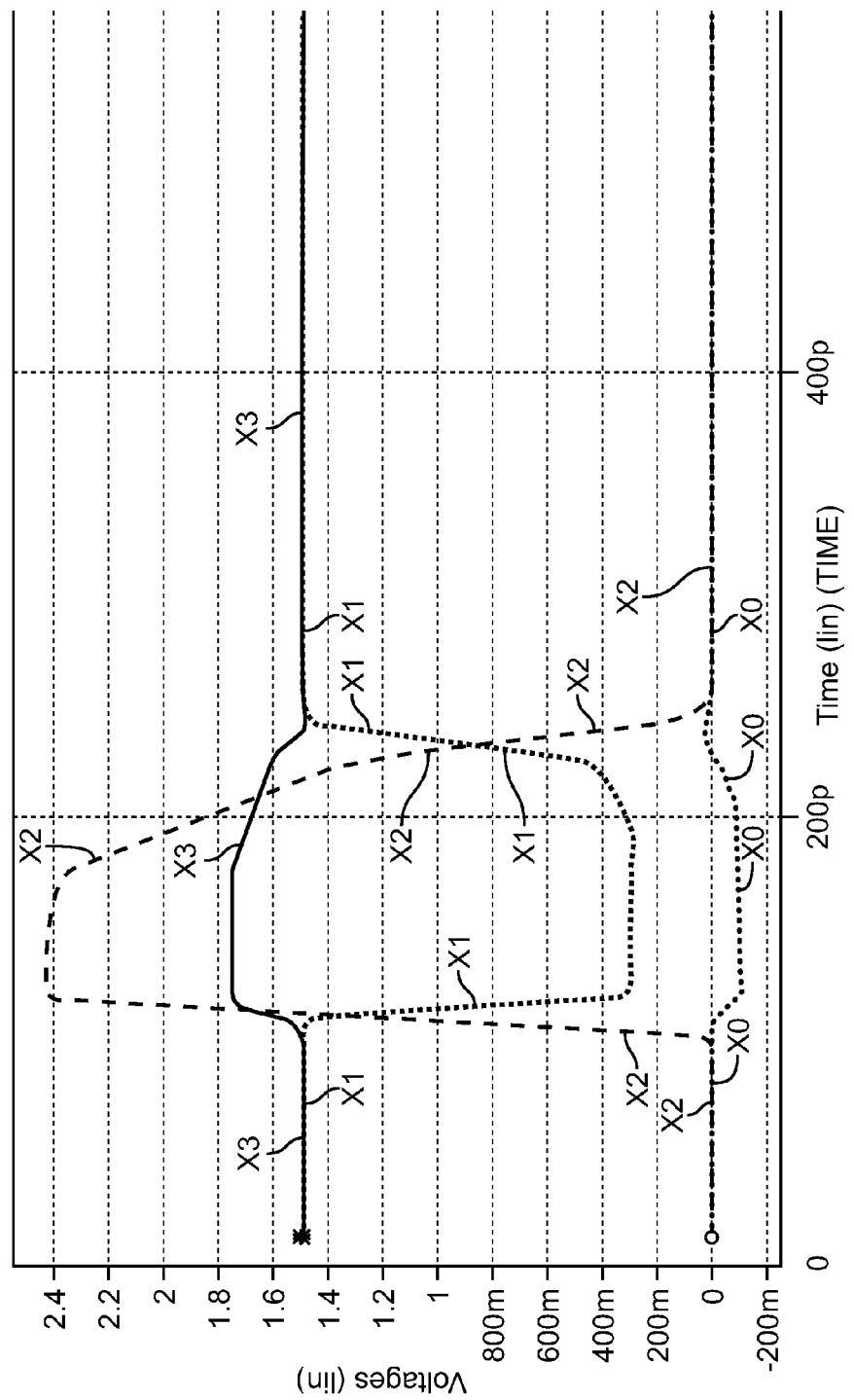
FIG. 6 is a graph of simulation results showing how the state of the illustrative memory cell of FIG. 3 will not flip when subjected to additional charge associated with a simulated soft error upset event in accordance with an embodiment of the present invention.

The architecture of memory element 20 helps improve immunity to soft error upset events. The results of a simulated soft error upset event are shown in FIG. 6. In the simulation of FIG. 6, the ADD and CLR signals are not asserted (i.e., these signals remain at ground). To simulate a soft error upset event, a 50 fC charge was injected on node X2. As the graph of FIG. 6 demonstrates, this leads to a substantial increase in the voltage on node X2 (e.g., from 0 V to a voltage substantially greater than Vcc) and temporarily perturbs the voltages on nodes X0, X1, and X3. In this example, node X3 is the "floating" node. Node X3 may increase slightly above Vcc due to capacitive coupling from node X2. Node X1 is the node that lowers to a voltage value less half of Vcc. Node X0 is the "unperturbed" node. Node X0 may decrease slightly below 0 V due to capacitive coupling from node X1. The charge 50 fC charge may dissipate successfully from node X2 without any permanent flip to the states of nodes X0, X1, X2, or X3. As shown in this example, cell 20 may be able to tolerate at least 50 fC of soft error disturbance.

Figure 7:
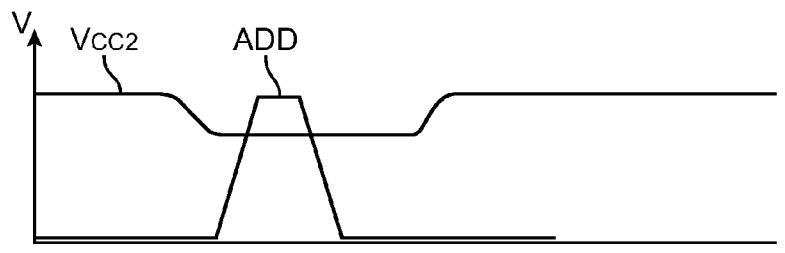
FIGS. 7-10 are graphs showing illustrative signals for a memory element that have had their magnitudes adjusted to facilitate data loading operations.

FIG. 7 shows how Vcc2 may be temporarily lowered to improve write margin during writing (i.e., when ADD is asserted). FIG. 7 is a simplified version of FIG. 5 that does not show the voltages on the internal storage nodes (e.g., nodes X0-X3).

Lowering Vcc2 during a write operation is only one way to improve write margin. Other techniques can also be used to assist with the write operation.

Figure 8:
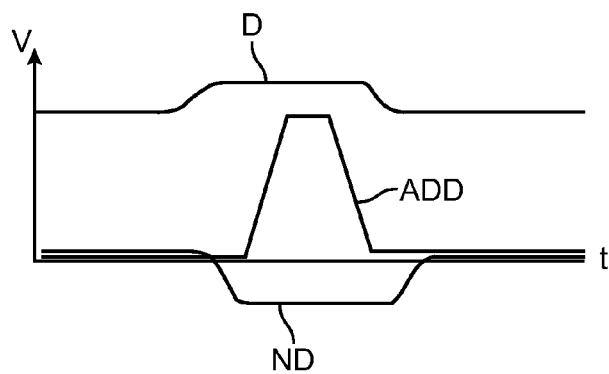

If desired, the voltages of the data and not data signals D and ND may be varied (individually or together). FIG. 8 shows an illustrative scenario in which D is momentarily increased and ND is momentarily decreased during a write operation to improve write margin. This type of increase need not be momentary (i.e., high D signals may always be elevated and the voltage of low ND signals may always be reduced). Boosting D beyond Vcc may increase the value of node X2 beyond Vcc. Increasing node X2 beyond Vcc may overdrive (e.g., drive the voltage difference between the gate and the source terminals over Vcc) transistor N1. Overdriving transistor N1 may strengthen transistor N1 and may allow transistor N1 to more effectively overpower P1 during a write operation. Likewise, lowering ND below 0 V may decrease the value of node X3 below 0 V. Decrease node X3 below 0 V may overdrive transistor P0. Overdriving transistor P0 may strengthen transistor P0 and may allow transistor to overpower transistor N0 during a write operation.

Figure 9:
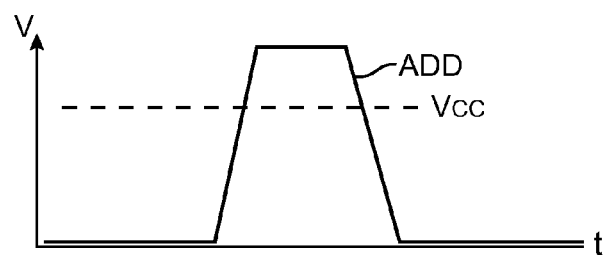

Another possible approach for improving write margin is shown in the example of FIG. 9 in which signal ADD is elevated with respect to Vcc. Boosting ADD beyond Vcc may strengthen address transistor N6. Consider a scenario in which node X2 is currently holding a 0, and it is desired to load a 1 into node X2. Data signal D and address signal ADD may be driven to Vcc. Address transistor N6 may attempt to raise node X2 to a high voltage. Node X3, however, is currently holding a 1, which means transistor N2 is on. Transistor N6 therefore competes with transistor N2 to raise node X2 to a high voltage. Boosting ADD beyond Vcc strengthens transistor N6 and allows transistor N6 to better overpower transistor N2. A stronger transistor N6 may results in a higher voltage at node X2. A higher voltage value at node X2 strengthens transistor N1 to help increase write margin. This type of boosted ADD signal may also be used for the CLR address signal and may be used for all addressing operations (if desired). When control signals such as ADD and CLR and data signals such as D and ND exhibit voltage swings that are larger than their nominal voltage ranges (i.e., when ADD or CLR is elevated above the normal logic "1" level, when ND is dropped below ground, when D is driven above the normal logic "1" level, etc.), these signals may be referred to as "overdriven" signals. The power supply voltage for these overdrive signals can be generated using adjustable power supply 22 of FIG. 2. Overdrive arrangements such as these may be used in combination with other voltage adjustments (e.g., power supply and/or body bias adjustments made using adjustable power supply 22) to ensure that operating margins are satisfactory for memory cells 20.

Figure 10:
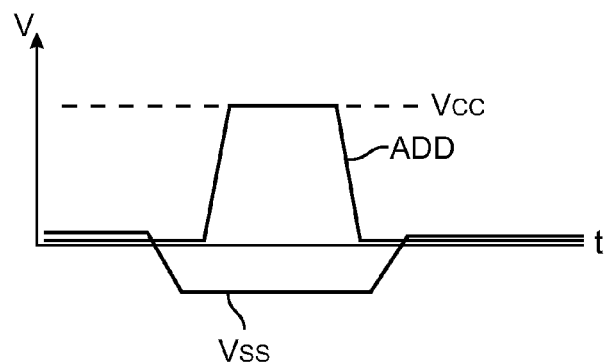

Instead of lowering Vcc2, another way to increase write margin is to temporarily lower ground voltage Vss, as shown in FIG. 10. Every transistor has a fourth terminal known as a body terminal. The body terminal of an NMOS transistor is typically tied to ground (e.g., a Vss value of 0 V) and the body terminal of a PMOS transistor is typically tied to supply voltage Vcc. Decreasing Vss below 0 V places transistor N1 under forward body bias (e.g., the body is at a higher voltage level relative to the source). Momentarily forward biasing the body in this way may therefore temporarily strengthen transistor N1 and may help improve write margin.

Figure 11:
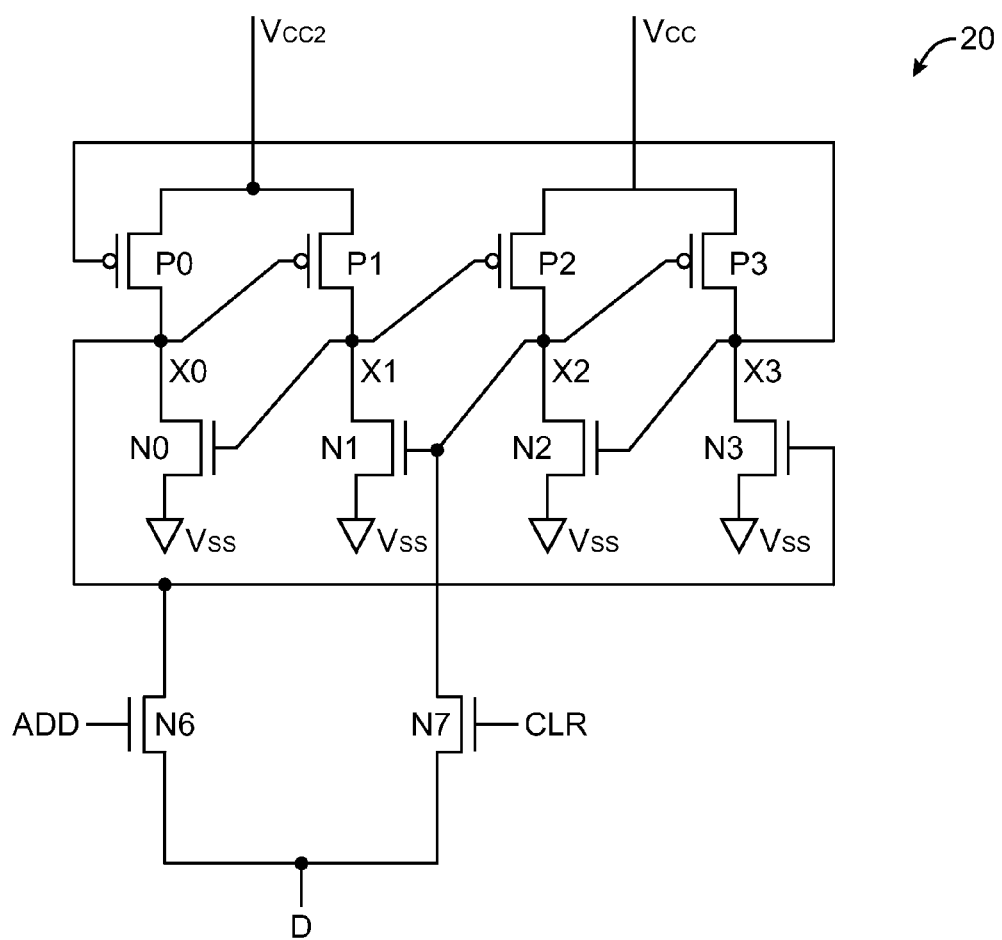
FIG. 11 is a diagram of an illustrative memory cell in accordance with an embodiment of the present invention.

Memory cell 20 of FIG. 3 may, if desired, be implemented so that transistors N6 and N7 are connected to non-consecutive storage nodes X0 and X2 respectively (or to nodes X1 and X3 respectively, if desired). Memory cell 20 arranged in this way may eliminate the need for not data signal ND. As shown in FIG. 11, the drain terminals of transistors N6 and N7 may be tied together and connected to data signal D. Any suitable method to help increase write margin (e.g., lowering Vcc2, boosting data signal D, overdriving the access control signals such as ADD and CLR, adjusting Vss to the source-drain terminals of the NMOS transistors, etc.). These methods may, for example, be applied to a memory cell in which transistors N6 and N7 are connected to non-adjacent storage nodes.

Figure 12:
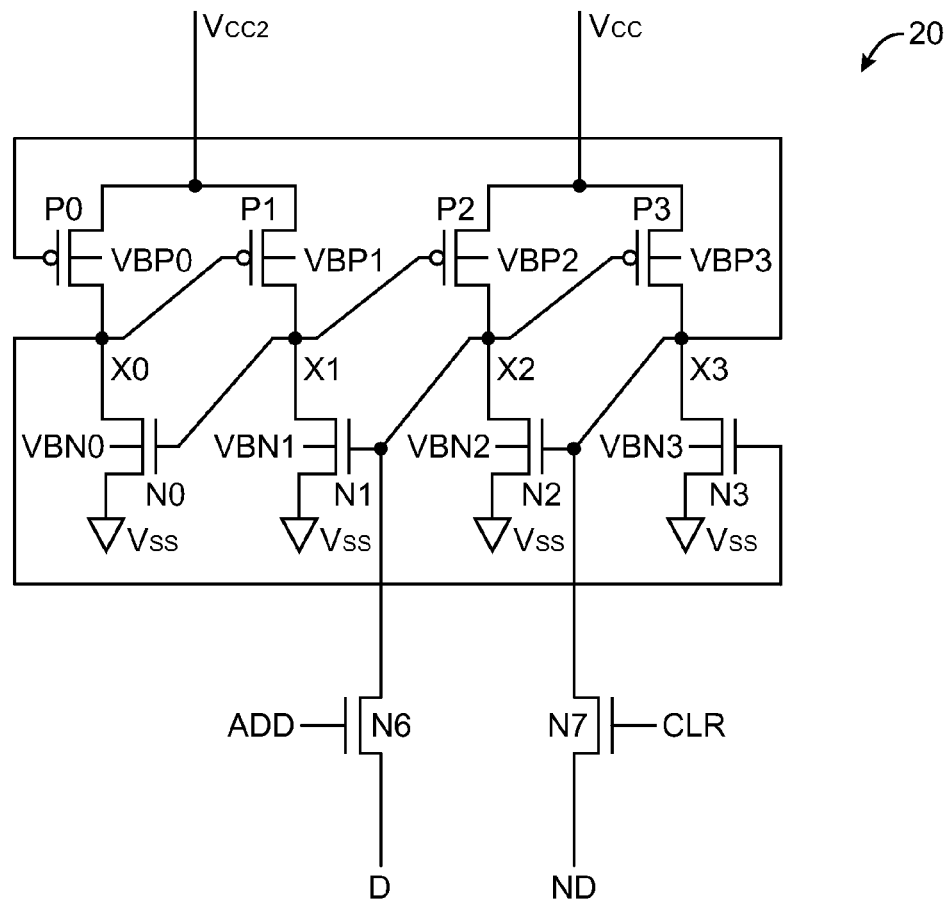
FIG. 12 is a diagram of an illustrative memory cell with body biasing terminals in accordance with an embodiment of the present invention.
Figure 13:
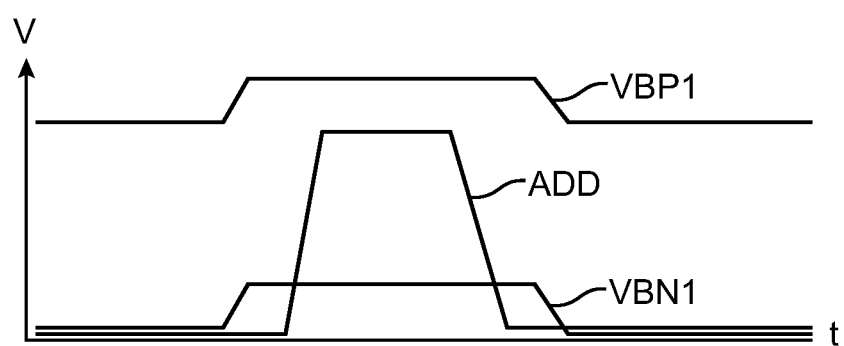
FIG. 13 is a graph showing illustrative signals for a memory element that have had their magnitudes adjusted to facilitate data loading operations.

As shown in FIG. 12, the memory cell described in connection with FIG. 3 may also be implemented using a configuration in that uses back body terminals (e.g., n-body bias terminals VBP0-3 and p-body bias terminals VBN0-3). For example, body terminal VBN1 may be temporarily increased above 0 V to place NMOS transistor N1 in forward body-bias. Body terminal VBP0 may also be temporarily increased above Vcc to place PMOS transistor P0 in reverse body-bias. Forward biasing the body of transistor N1 and reverse biasing the body of transistor P0 during a write operation (see, e.g., FIG. 13) may help them overpower transistors P1 and N0 respectively, which helps improve write margin. VBP0-3 and VBN0-3 may be controlled by additional body biasing lines (not shown) provided by circuitry 24.

The examples of FIGS. 7-10 and 13 are merely illustrative. Any suitable time-varying changes or other changes to the signals used in loading and reading data from memory element 20 may be made if desired. These changes may include changes to positive power supply voltages such as Vcc2 and Vcc, changes to the magnitude of the address signal ADD, changes to the magnitude of clear signal CLR, changes to the magnitude of the high and low values of data signals D and ND, changes to ground voltages such as Vss, changes to body biasing terminals, or any suitable combination of these changes. Changes such as these may be made, for example, to increase write margin, to ensure sufficient the output voltage from the memory element during read operations, to accommodate or produce enhanced output voltages from the memory element during normal operation in a CRAM array, etc.

Figure 14:
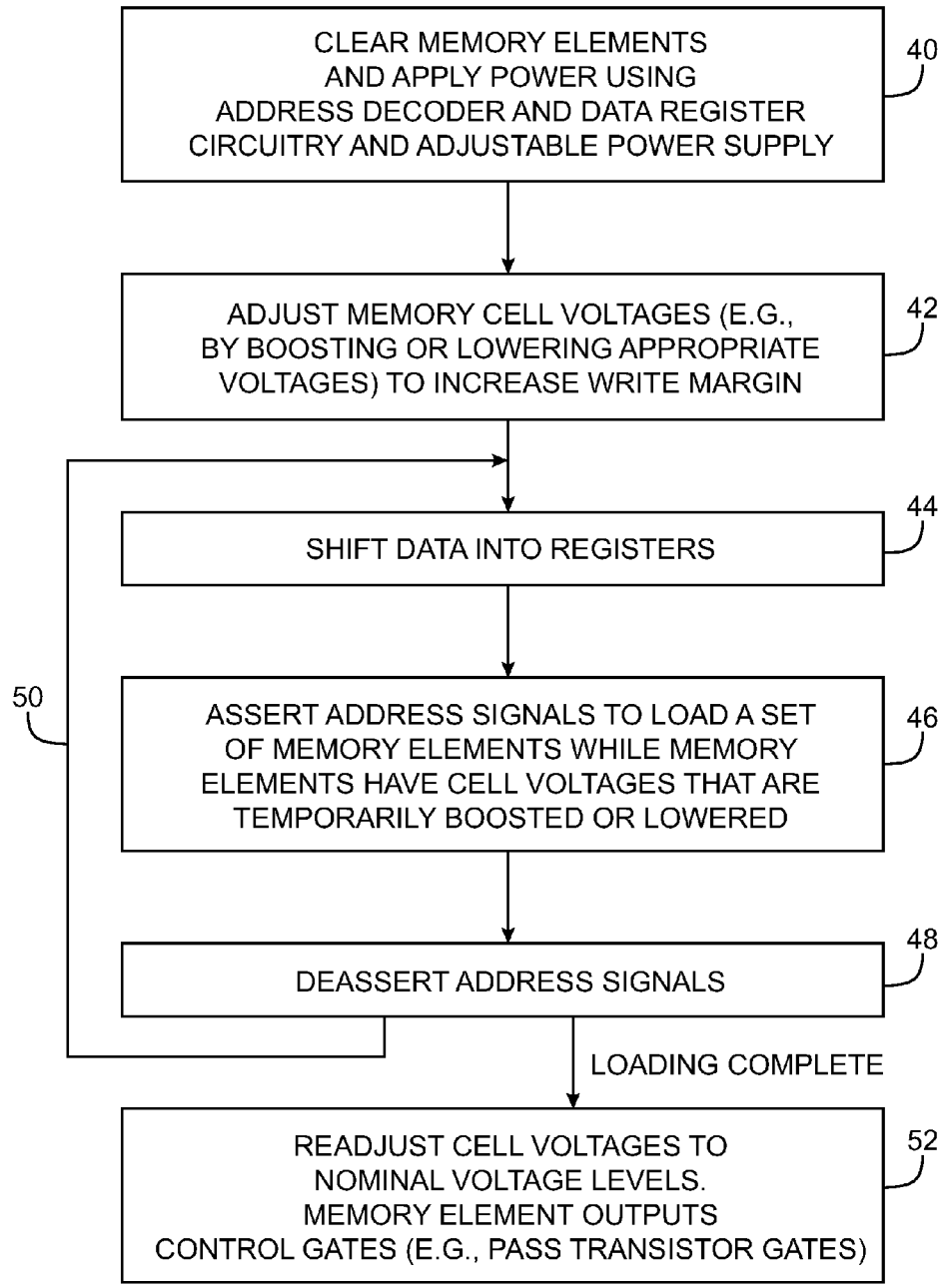
FIG. 14 is a flow chart of illustrative steps involved in loading data into a memory element of the type shown in FIGS. 3, 11, and 12 in accordance with an embodiment of the present invention.

FIG. 14 shows illustrative steps involved in loading a memory array formed of memory elements such as memory element 20. At step 40, all the memory cells may be cleared by loading a 0 into node X3, as an example. This can be accomplished by asserting the CLR signal and driving complement data signal ND to ground. Address signal ADD and data signal D may be optionally driven to Vcc to help assist the clear operation.

At step 42, any appropriate memory element voltage (e.g., Vcc, Vcc2, Vss D, ND, ADD, CLR, VBN0-3, VBP0-3, etc.) may be changed in magnitude (e.g., boosted above or lowered below its nominal range) to help improve write margin. The voltage magnitude adjustments that are made may include power supply voltage adjustments (e.g., changes to Vcc, Vcc2, or Vss), data signal adjustments (e.g., changes to the magnitude of D to overdrive D, changes to the magnitude of ND to overdrive ND), and address signal adjustments (e.g., changes to the magnitude of ADD to overdrive ADD, changes to the magnitude of CLR to overdrive CLR, etc.). Any of the techniques shown in connection with FIGS. 4-10 and 13 may be used, if desired. Any combination or permutation of these techniques may be used during the operations of step 42. For example, prior to asserting ADD, Vcc2 may be lowered, data signal D may be boosted, Vss may be decreased, and/or VBN1 may be elevated from their nominal voltage values.

Circuitry 24 may include registers. Data may be shifted into the registers to place desired data values onto data lines 32 (step 44).

Once data is ready to be loaded, the appropriate address signals (e.g., ADD and CLR) may be asserted to load a set of memory elements (e.g., shown as a column of memory cells in FIG. 2). The address signals may be boosted (overdriven) beyond Vcc, if desired. During this step (step 46), the memory element voltages that were boosted or lowered during step 42 may still be applied to the memory cells. Loading a set of memory elements loaded in this way may help ensure successful writing of data into the set of memory elements.

After a column of memory cells has been loaded with data, the address signals may be deasserted (step 48). If more memory cells need to be loaded, path 50 may be taken to shift the next set of data into the next set of memory elements.

At step 52, if loading is complete (e.g., the array of memory elements have been successfully loaded with desired data values), the cell voltages that were boosted or lowered during step 46 may be readjusted back to their nominal levels (e.g., Vcc2 back to Vcc, Vss back to 0 V, etc). During normal operations, the array of memory elements may then be used to provide static outputs. The static outputs may be used to control the gates of transistors (as an example). In the context of programmable circuits such as programmable logic device circuits, the array of memory elements may be used as a configuration memory array to provide control signals to the gates of programmable logic pass transistors.

Figure 15:
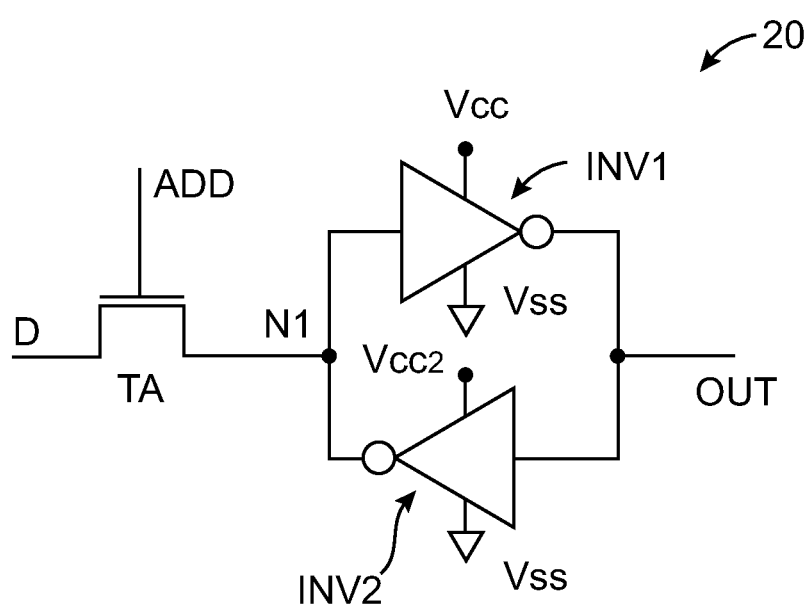
FIG. 15 is a diagram showing how a memory element may be formed that has a bistable cell based on two cross-coupled inverters powered with independently controlled power supply voltages in accordance with an embodiment of the present invention.

As shown in FIG. 15, memory element 20 may be implemented using different numbers of transistor pairs. The example of FIG. 15 involves the use of two cross-coupled inverters (INV1 and INV2) each of which has two series-connected transistors (for a total of five transistors in element 20). This is merely illustrative. Memory element 20 may have any suitable number of transistors.

In element 20 of FIG. 15, cross-coupled inverters INV1 and INV2 form a bistable cell. Inverter INV1 may be powered by positive power supply voltage Vcc and ground power supply voltage Vss. Inverter INV2 may be powered by positive power supply voltage Vcc2 and ground power supply Vss. As described in connection with FIG. 14, power supply voltage Vcc2 may be selectively lowered during data writing operations to enhance write margin. When Vcc2 is lowered, the strength of INV2 is weakened, making it easier for address transistor TA to drive data signal D onto node N1.

The foregoing is merely illustrative of the principles of this invention and various modifications can be made by those skilled in the art without departing from the scope and spirit of the invention.

What is claimed is:

1. Memory element circuitry, comprising:
   a memory element having at least four interconnected inverter-type transistor pairs and at least one access circuit, wherein the memory element is configured to store data on internal nodes; and
   circuitry that loads data into the memory element while changing a magnitude of a power supply voltage that powers the memory element.

2. The memory element circuitry defined in claim 1 wherein the access circuit comprises a pair of access transistors.

3. The memory element circuitry defined in claim 1 wherein the memory element has a first positive power supply terminal and a second positive power supply terminal and wherein the circuitry that loads the data comprises an adjustable power supply that momentarily lowers a positive power supply voltage on the first positive power supply terminal.

4. Memory element circuitry, comprising:
   a memory element having at least four interconnected inverter-type transistor pairs and at least one access circuit, wherein the memory element is configured to store data on internal nodes; and
   circuitry that loads data into the memory element while changing at least one of: a magnitude of a power supply voltage that powers the memory element, a data signal magnitude for a data signal being loaded into the memory element, and an address signal magnitude for an address signal controlling the access circuit, wherein the circuitry that loads the data is configured to overdrive the data signal during loading of the data.

5. Memory element circuitry, comprising:
   a memory element having at least four interconnected inverter-type transistor pairs and at least one access circuit, wherein the memory element is configured to store data on internal nodes; and
   circuitry that loads data into the memory element while changing at least one of: a magnitude of a power supply voltage that powers the memory element, a data signal magnitude for a data signal being loaded into the memory element, and an address signal magnitude for an address signal controlling the access circuit, wherein the circuitry that loads the data is configured to overdrive the address signal during loading of the data.

6. The memory element circuitry defined in claim 1, further comprising:
   a first power supply line on which only an adjustable power supply voltage is provided, wherein first and second inverter-type transistor pairs in the at least four interconnected inverter-type transistor pairs are powered using the adjustable power supply voltage.

7. The memory element circuitry defined in claim 6, further comprising:
   a second power supply line on which only a fixed power supply voltage is provided, wherein third and fourth inverter-type transistor pairs in the at least four interconnected inverter-type transistor pairs are powered using the fixed power supply voltage.

8. The memory element circuitry defined in claim 7, further comprising:
   an address line, wherein the first and second inverter-type transistor pairs are powered using the adjustable power supply voltage that differs from the fixed power supply voltage while an address signal on the address line is asserted to load data into the memory element.

9. The memory element circuitry defined in claim 8, further comprising:
   a third power supply line on which a third power supply voltage that is lower than the fixed and adjustable power supply voltages is provided, wherein the first and second inverter-type transistor pairs are coupled between the first power supply line and the third power supply line, and wherein the third and fourth inverter-type transistor pairs are coupled between the second power supply line and the third power supply line.

10. A method of operating memory element circuitry that includes a memory element and data loading circuitry, comprising:
    storing data in the memory element, wherein the memory element includes at least four interconnected inverter-type transistor pairs and an access circuit; and
    with the data loading circuitry, loading data into the memory element while changing a magnitude of a power supply voltage that powers the memory element.

11. The method defined in claim 10, further comprising:
    loading data into the memory element while changing a data signal magnitude of a data signal that is being loaded into the memory element.

12. The method defined in claim 10, further comprising:
    loading data into the memory element while changing an address signal magnitude of an address signal that controls the access circuit.

13. The method defined in claim 11, further comprising:
    with a first power supply line, supplying only a fixed power supply voltage to first and second inverter-type transistor pairs in the at least four interconnected inverter-type transistor pairs; and
    with a second power supply line, supplying a ground power supply voltage, wherein the first and second inverter-type transistor pairs are coupled between the first and second power supply lines.

14. The method defined in claim 13, further comprising:
    with a third power supply line, supplying an adjustable power supply voltage to third and fourth inverter-type transistor pairs in the at least four interconnected inverter-type transistor pairs, wherein the third and fourth inverter-type transistor pairs are coupled between the third and second power supply lines.

15. The method defined in claim 13, further comprising:
    loading data into the memory element while changing a data signal magnitude of a data signal that is being loaded into the memory element to be greater than the fixed power supply voltage.

16. The method defined in claim 13, further comprising:
loading data into the memory element while changing an address signal magnitude of an address signal that controls the access circuit to be greater than the fixed power supply voltage.

17. The method defined in claim 10 further comprising:
supplying a subset of the at least four interconnected inverter-type transistor pairs with a time-varying power supply voltage;
asserting an address signal on an address line to load the data into the memory element.

18. The method defined in claim 17, further comprising:
momentarily adjusting the time-varying power supply voltage while the address signal is asserted.

19. The method defined in claim 10, wherein the access circuit includes a first transistor that is coupled between a data line and a first data storage node in the memory element, wherein the access circuit includes a second transistor that is coupled between the data line and a second data storage node in the memory element, and wherein loading the data comprises loading the data into the memory element using a selected one of the first and second transistors.

20. The method defined in claim 10, wherein the access circuit includes a first transistor that is coupled between a first data line and a first data storage node in the memory element, wherein the access circuit includes a second transistor that is coupled between a second data line and a second data storage node in the memory element, and wherein loading the data comprises loading the data into the memory element using at least one of the first and second transistors.

* * * * *